(12) United States Patent
Covington

(10) Patent No.: US 6,730,395 B2
(45) Date of Patent: May 4, 2004

(54) MAGNETIC TUNNEL JUNCTION USING NANOPARTICLE MONOLAYERS AND APPLICATIONS THEREFOR

(75) Inventor: Mark William Covington, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 123 days.

(21) Appl. No.: 09/683,357

(22) Filed: Dec. 18, 2001

(65) Prior Publication Data

US 2002/0074541 A1 Jun. 20, 2002

Related U.S. Application Data

(60) Provisional application No. 60/256,435, filed on Dec. 18, 2000.

(51) Int. Cl.[7] .......................... B32B 15/04; B32B 15/16; B32B 31/26; B32B 31/14
(52) U.S. Cl. ...................... 428/323; 428/457; 428/692; 428/693; 360/324; 360/324.2; 427/130
(58) Field of Search ................................. 428/323, 328, 428/457, 692, 693, 615; 360/324.2, 324.11; 324/252; 427/130

(56) References Cited

U.S. PATENT DOCUMENTS

| | | | |
|---|---|---|---|
| 5,640,343 A | | 6/1997 | Gallagher et al. |
| 5,986,858 A | | 11/1999 | Sato et al. |
| 6,083,764 A | | 7/2000 | Chen |
| 6,159,620 A | * | 12/2000 | Heath et al. ................ 428/615 |
| 6,165,287 A | | 12/2000 | Sato et al. |
| 6,183,859 B1 | | 2/2001 | Chen et al. |
| 6,226,160 B1 | | 5/2001 | Gallagher et al. |
| 6,232,777 B1 | * | 5/2001 | Sato et al. .................. 324/252 |
| 6,261,646 B1 | | 7/2001 | Chen et al. |
| 6,296,741 B1 | | 10/2001 | Pinarbasi |
| 6,341,053 B1 | * | 1/2002 | Nakada et al. ........... 360/324.2 |

OTHER PUBLICATIONS

"Spin Dependent Tunneling in Self–Assembled Cobalt–Nanocrystal Superlattices" Black et al., Science, vol. 290, Nov. 10, 2000, pp. 1131–1134.*

"Synthesis of monodisperse cobalt nanocrystals and their assembly into magnetic superlattices" Sun et al. Journal of Applied Physics, vol. 85, #5, Apr. 15, 1999, pp. 4325–4330.*

Moodera, J.S., Kinder, Lisa R., Wong, Terrilyn M., Meservey, R., LargeMagnetoresistance at Room Temperature in Ferromagnetic Thin Film Tunnel Junctions, Pysical Review Letters, The American Physical Society, vol. 74, No. 16, Apr. 17, 1995, pps. 3273–3276.

(List continued on next page.)

Primary Examiner—Paul Thibodeau
Assistant Examiner—Nikolas J. Uhlir
(74) Attorney, Agent, or Firm—Buchanan Ingersoll; Dennis Cavleton

(57) ABSTRACT

A fundamentally new magnetic tunnel junction technology based on the use of magnetic nanoparticles is disclosed. The hard layer of the device is composed of the nanoparticles, while the junction insulating barrier is composed of a carbon-based coating on the nanoparticles. This device offers a markedly different approach of tunnel junction fabrication and offers many advantages over the prior art technology, which is based on the use of oxidized aluminum as the insulating barrier.

20 Claims, 4 Drawing Sheets

OTHER PUBLICATIONS

Parkin, S.S.P., Roche, K.P., Samant, M.G., Rice, P.M., Beyers, R.B., Scheuerlein, R.E., O'Sullivan, E.J., Brown, S.L., Bucchigano, J., Abraham, D.W., Lu, Yu, Rooks, M., Trouilloud, P.L., Wanner, R.A., Gallagher, W.J., Exchange–Biased Magnetic Tunnel Junctions and Application to Nonvolatile Magnetic Random Access Memory (invited), Journal of Applied Physics, vol. 85, No. 8, Apr. 15, 1999, pps. 5828–5833.

Moodera, Jagadeesh S., Gallagher, Elizabeth F., Robinson, Keziah and Nowak, Janusz, Optimum Tunnel Barrier in Ferromagnetic–Insulator–Ferromagnetic Tunneling Structures, American Institute of Physics, 1997,pps. 3050–3052.

Cardoso, S., Freitas, P.P., de Jesus, C., Wie, P. and Soares C., Spin–Tunnel–Junction Thermal Stability and Interface Interdiffusion above 300° C, Applied Physics Letters, vol. 75, No. 5, Jan. 31, 2000, pps. 610–612.

Kleinsasser, A.W., Miller. R.E., Mallison, W.H. and Arnold, G.B., Observation of Multiple Andreev Reflections in Superconducting Tunnel Junctions, Physical Review Letters, vol. 72, No. 11, Mar. 14, 1994, pps. 1738–1741.

Sun, Shouheng and Murray, C.B., Synthesis of Monodisperse Cobalt Nanocrystals and their Assembly into Magnetic Superlattices (invited), Journal of Applied Physics, vol. 85, No. 8, Apr. 15, 1999, pps. 4325–4330.

Sun, Shouhen, Murray, C.B., Weller, Dieter, Folks, Liesl, Moser, Andreas, Monodisperse FePt Nanoparticles and Ferromagnetic FePt Nanocrystal Superlattices, Science, vol. 287, Mar. 17, 2000, pps. 1989–1992.

Black, C.T., Murray, C.B., Sandstrom, R.L., Sun Shouheng, Spin–Dependent Tunneling in Self–Assembled Cobalt–Nanocrystal Superlattices, Science, vol. 290, Nov. 10, 2000, pps. 1131–1134.

Nuzzo, Ralph G., Allara, David L., Absorption of Bifunctional Organic Disulfides on Gold Surfaces, American Chemical Society, 1983, pps. 4481–4483.

Andres, Ronald P., Bein, Thomas, Dorogi, Matt, Feng, Sue, Henderson, Jason, I., Kubiak, Clifford P., Mahoney, William, Osifchin, Richard G., Reifenberger, R., "Coulomb Staircase" at Room Temperature in a Self–Assembled Molecular Nanostructure, Science, vol. 272, May 31, 1996, pps. 1323–1325.

Covington, M., Aprili, M., Paraoanu, E., Greene, L.H., Observation of Surface–Induced Broken Time–Reversal Symmetry In YBa2Cu3O7 Tunnel Junctions, Physical Review Letters, vol. 79, No. 2, Jul.

Covington, M., Xu, F., Mirkin, C.A., Feldmann, W.L., Greene, L.H., Tunneling Spectroscopy of Superconducting Y1–$x$Pr$x$Ba2Cu3O7 Thin Films, Proceedings of the XXI International Conference on Low–Temperature Physics, Aug. 8–14.

Petta, Jason R., Salinas, D.G., and Ralph, D.C., Measurements of Discrete Electronic States in a Gold Nanoparticle using Tunnel Junctions formed from Self–Assembled Monolayers, Applied Physics Letters, vol. 77, No. 26, Dec. 25, 2000, pps. 4419–4421.

* cited by examiner

MAGNETIC TUNNEL JUNCTION USING NANOPARTICLE MONOLAYERS AND APPLICATIONS THEREFOR

CROSS REFERENCE TO RELATED APPLICATIONS

Referenced-Applications

This application claims the benefit of U.S. Provisional Application Serial No. 60/256,435, filed Dec. 18, 2000.

BACKGROUND OF INVENTION

Tunnel junctions with ferromagnetic electrodes are known to exhibit a large magnetoresistance. This makes magnetic tunnel junctions a strong candidate for applications requiring magnetic sensors, such as high areal density magnetic recording heads, magnetic random access memory (MRAM), and field sensors. However, these applications require junctions with low resistance.

To date, oxidized aluminum is the most widely used material from which the thin insulating tunnel barrier necessary for making low-resistance junctions can be formed. In this case, the aluminum thin film is deposited on the hard layer of the tunnel junction and then oxidized to form the insulating barrier. While many groups have successfully fabricated low-resistance junctions using this method, there are several challenges involved when scaling this technique into a production-level process.

First, tunnel junction performance is strongly dependent upon aluminum thickness when the insulating barriers are very thin. Thus, thin film deposition tools must be able to deposit ~7 Å of aluminum with sub-angstrom accuracy and precision over an entire wafer. Second, there is evidence that aluminum interdiffuses into conventional electrode materials, such as CoFe and NiFe, which makes the fabrication of monolayer thick barriers difficult. Third, oxidation of the bottom junction electrode must be minimized. Lastly, the oxidized aluminum barriers intermix with CoFe and NiFe, causing irreversible damage, when exposed to temperatures above 250–300° C. This can be a problem because wafer processing can expose on-wafer devices to temperatures of 250° C. and above.

Magnetic tunnel junction performance is strongly dependent upon the thickness and quality of the insulating barrier and its interaction with the ferromagnetic electrodes. Current state-of-the-art junctions have resistance-area products (a measure of the intrinsic barrier resistance) of $R^*A = \sim 10$ $\Omega\text{-}\mu m^2$, which is consistent with an alumina barrier between one and two monolayers thick. However, even this low of a resistance is potentially too high for magnetic recording heads. Attempts to push the oxidized aluminum tunnel barrier technology to monolayer thickness have yielded junctions with pinholes or gaps across the barrier. The end result is that the junctions exhibit near zero magnetoresistance and extremely poor magnetic properties.

It is known in the art that small ferromagnetic nanocrystals can be formed out of materials such as Co and FePt. The size of these nanocrystals can, in principle, be tuned by varying preparation conditions, but are typically on the order of ~10 nm in diameter. Furthermore, they have a nearly monodisperse distribution in size ($\delta \sim 5\%$). The nanocrystals can be applied to wafers by dissolving the particles in a solvent, spreading the solvent/nanocrystal solution on a wafer surface, and inducing a controlled evaporation of the solvent. Using this technique, nanocrystal superlattices one to three monolayers thick have been achieved.

It is desirable to develop a more robust process for fabricating low resistance ferromagnetic tunnel junctions for use in magnetic sensor application to eliminate or reduce the above described difficulties. Further, it would be desirable to replace the oxidized aluminum monolayer with a monolayer composed of ferromagnetic nanoparticles.

SUMMARY OF INVENTION

Disclosed is a magnetic sensor utilizing a tunnel junction which is an improvement over prior art tunnel junctions. The improved tunnel junction ideally consists of a monolayer of ferromagnetic nanoparticles, such as FePt. Surrounding the nanoparticles is an insulating layer composed of oleic acid or other carbonaceous coating. Non-magnetic electrical leads deposited to the top and bottom of the tunnel junction are used to pass current through the device in a perpendicular-to-the-plane (CPP) configuration.

BRIEF DESCRIPTION OF DRAWINGS

FIG. 3 is a schematic illustration of the magnetics and electrical response of the nanoparticle-based tunnel junction.

DETAILED DESCRIPTION

Figure 1:
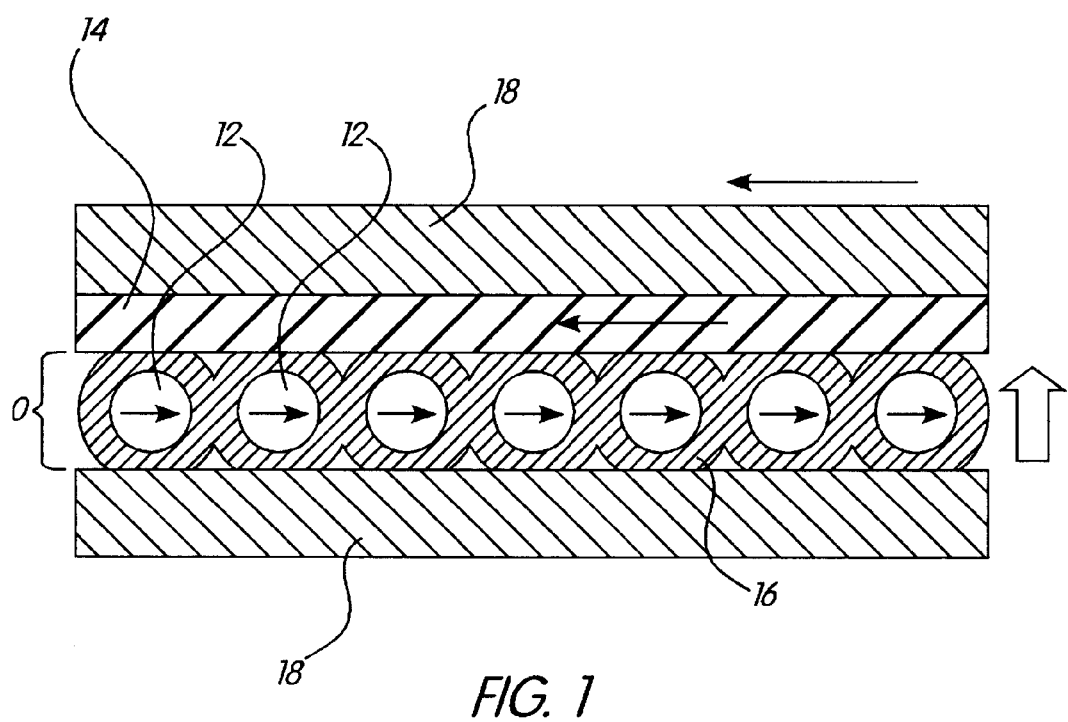
FIG. 1 is a cross section of a magnetic tunnel junction incorporating a monolayer of monodisperse ferromagnetic nanoparticles.

The basic device according to the invention is shown schematically in cross-section in FIG. 1. Monolayer 10 acts as a solid layer of a hard magnetic material and ideally consists of single layer of monodisperse nanoparticles 12. Nanoparticles 12 are composed of a ferromagnetic material. As mentioned before, monolayers have been successfully constructed of Co and FePt, however, it is possible that other ferromagnetic materials may be used, as long as the materials exhibit certain characteristics, such as:

A large magnetic anisotropy that ensures the particles remain ferromagnetic at the device operation temperature (i.e. they are not in the superparamagnetic regime).

A large electron spin polarization so that the device will exhibit a large magnetoresistance.

A large coercivity to ensure good stability of the hard layer.

Compatibility with some sort of self-assembly process that produces densely packed monolayers.

Nanometer scale size and a nearly monodisperse size distribution to minimize surface roughness and any concomitant magnetostatic coupling across the tunnel barrier.

Nanoparticles 12 are suspended in a coating of carbon-based molecules 16, such as oleic acid or another carbonaceous coating, which serves as the insulating barrier between nanoparticles 12 and free layer 14. The carbon-based nature of the insulating barrier means there will be no paramagnetic spin-flip scattering defects in the insulator that will corrupt the junction magnetoresistance.

Free layer 14 is placed either above or below monolayer 10. Freelayer 14 is composed of a soft magnetic material, and could be deposited by conventional sputter deposition, or any other deposition process well known in the art, along with the non-magnetic electrical contacts 18. Non-magnetic electrical contacts 18 are connected to the top and bottom of the device and are used to pass electrical current through the device in a perpendicular-to-the-plane (CPP) geometry.

As previously stated, nanoparticles 12 can be composed of Co of FePt. However, neither Co nor FePt nanocrystals are ferromagnetic in their as-prepared state, due to a combination of crystal structure and superparamagnetism. It has been found, upon annealing at temperatures of ~500 C. for approximately 30 minutes, that FePt orders into the $L1_0$ structural phase.

This crystallographic phase has a very large magnetic anisotropy that overcomes superparamagnetism and yields nanocrystals that are ferromagnetic at room temperature. In addition to producing the ferromagnetic crystal phase of FePt, the high temperature anneal of the nanoparticles promotes mechanical robustness of the self-assembled nanoparticle film. This is an improvement over previous attempts as using self-assembled monolayers as tunnel barriers, which can be damaged during tunnel junction fabrication.

Further, the preparation, self-assembly, and annealing of the nanocrystal monolayer can be done without the presence of oxygen, thereby avoiding the oxidation of the ferromagnetic electrodes and the concomitant degradation in magnetoresistance seen with prior art oxidized aluminum tunnel junctions.

It is also possible that annealing nanoparticles 12 in the presence of a magnetic field will induce crystallographic ordering such that the magnetic anisotropy is aligned along the field direction. For the case of this tunnel junction device, the aligning field should be applied within the plane of the wafer.

After the thermal anneal, carbon-based molecules surrounding each particle decompose into a carbonaceous coating 16 that is thin enough to allow electron tunneling between nanocrystals. The carbon-based molecules (or decomposed carbonaceous coating) 16 therefore acts as a tunnel barrier for current-carrying electrons moving perpendicular to the plane of the film. The thickness of the barrier is set by the lengths of identical carbon-based molecules 16 chemically bonded to nanoparticles 12. Because the molecule size is set by the lengths of the chemical bonds and number of atoms, the overall length is quantized, resulting in superior thickness uniformity over oxidized aluminum tunnel barriers. Potential thickness variations in the barrier induced by decomposition will be strictly local and still likely to be more uniform than oxidized aluminum. Further, because nanoparticles 12 are nearly monodisperse in size, the roughness of the device should be on the order of a few A, which is comparable to, if not better than, a device fabricated with an oxidized aluminum barrier. This simply follows from the tight size distribution, typically with a standard deviation of 5% to 7%, and small particle size (nanoparticles of ~6 nm are known in the prior art). The end result is minimization of undesirable effects like ferromagnetic Neél coupling across the tunnel barrier.

Figure 2A:
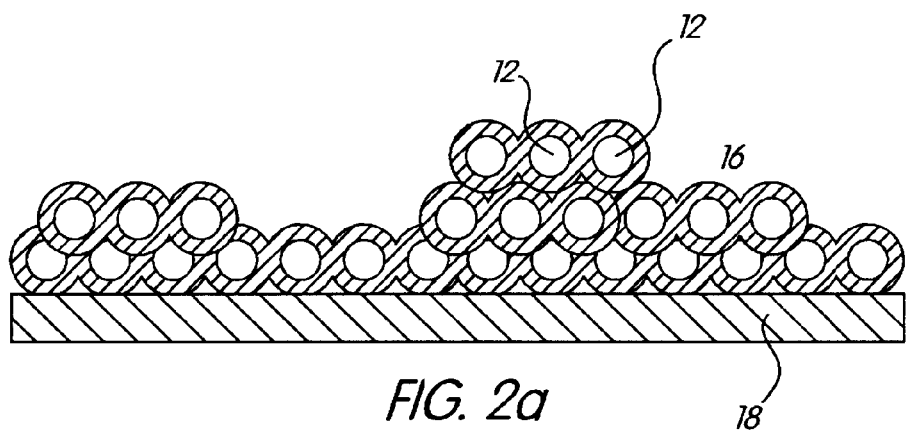
FIG. 2(a) illustrates a non-uniform nanoparticle superlattice varying in depth from one to three monolayers across the wafer surface.

It is unknown at this time if true single molecule monolayers can be achieved, or achieved in an economical manner. It is known in the prior art to construct superlattices between one and three monolayers thick, as shown in FIG. 2(a). Even if this technology cannot be refined to yield true monolayer films, the monolayers shown in FIG. 2(a) could still be used to construct a tunnel junction for use as a magnetoresistive sensor for application such as a magnetic memory cell (MRAM), where the constraints on device resistance are less stringent than for recording heads. For the situation in FIG. 2(a), it would be best to deposit the free layer first and then apply the nanoparticle film in such a way as to prevent any oxidation of the bottom electrode. Then, the free layer/insulator/nanoparticle structure will be smooth to promote good magnetics. The extra layers in the nanoparticle superlattice will simply add field-independent resistance.

Figure 2B:
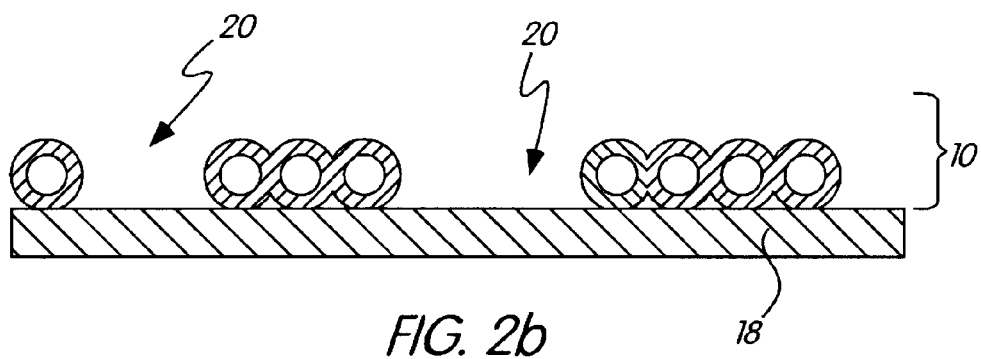
FIG. 2(b) illustrates incomplete coverage of a wafer surface by nanoparticles.
Figure 2C:
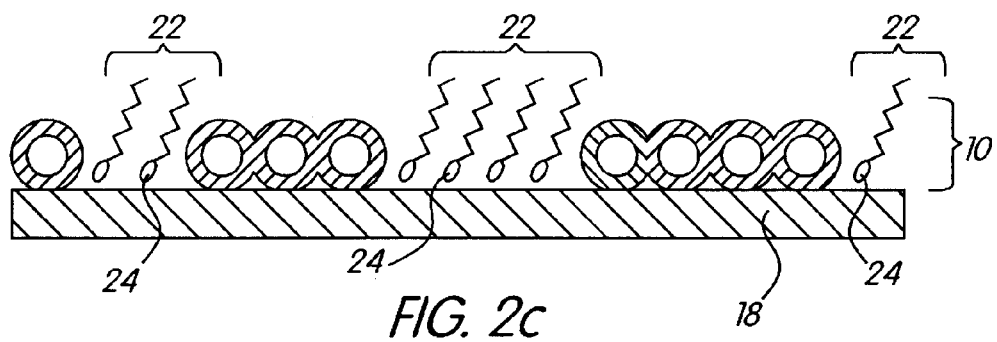
FIG. 2(c) illustrates a possible solution for the incomplete monolayer coverage shown in FIG. 2(b) by "filling in" gaps in the nanocrystal monolayer through the absorption of long-chain hydrocarbon molecules.

An alternative to using lattices one to three monolayers thick, which would increase resistance and limit the applications of the device, is to form a nanoparticle film which is never locally more than one monolayer thick (i.e., virtually uniform in thickness over the entire surface of the monoayer). This is shown in cross-section schematically in FIG. 2(b). This results in holes or gaps 20 in the monolayer. As illustrated in FIG. 2(c), a second monolayer film with the appropriate chemistry can be used to "fill in" holes 20 of nanoparticle monolayer 10 by bonding to the exposed patches of the underlying wafer surface. The filling-in of holes 20 could be done with at least one, but possibly more, layers of hydrocarbon-based molecules 22 that makes a tunnel barrier much thicker than that around the nanoparticles. Hydrocarbon-based molecules 22 are ideally long chains of hydrocarbons with a molecule 24 on one or both ends that will chemically bond with electrical contact 18, such as to anchor the hydrocarbon chain to the electrical contact. Such bonding will provide mechanical stability to the entire monolayer 10. The choice of material for molecule 24 would therefore be a function of the material used for electrical contact 18. For example, if a gold electrical contact is used, a thiol (SH—sodium and hydrogen) molecule may be used to anchor the hydrocarbon chain. The sharp exponential increase in tunneling resistance with barrier thickness will force the vast majority of the tunneling current to go through nanoparticles 12, with the end result being a reduction in the "active area" of the tunnel junction device.

FIGS. 2(a–c) show various implementations of monolayers which deviate from the ideal situation in which the monolayer, over its entire surface, is only one nanoparticle thick. Because a mass manufacturing process is likely to produce monolayers which are either more than one nanoparticle thick and non-uniform, as in FIG. 2(a), or which are one nanoparticle thick, but which exhibit pinholes or gaps, as in FIGS. 2(b & c), it is to be understood that the term "monolayer" as used herein and in the claims is meant to refer to an ideal monolayer, or a monolayer which conforms to FIG. 2(a) or 2(b–c).

The basic device structure disclosed herein is very similar in function to current spin valve technology and can be easily incorporated into present or proposed biasing and stabilization schemes for the free layer. However, due to the nature of the tunneling magnetoresistance, the hard layer and free layer only need be thick enough to exhibit bulk spin polarization. Typically, ~20 Å is sufficient for sheet films. As long as the nanoparticles remain ferromagnetic and maintain a high spin polarization, they can be made arbitrarily small. Therefore, the tunnel junction can be significantly thinner than current state-of-the-art spin valves, and the shield-to-shield spacing in a recording head can be significantly reduced.

Figure 3A:
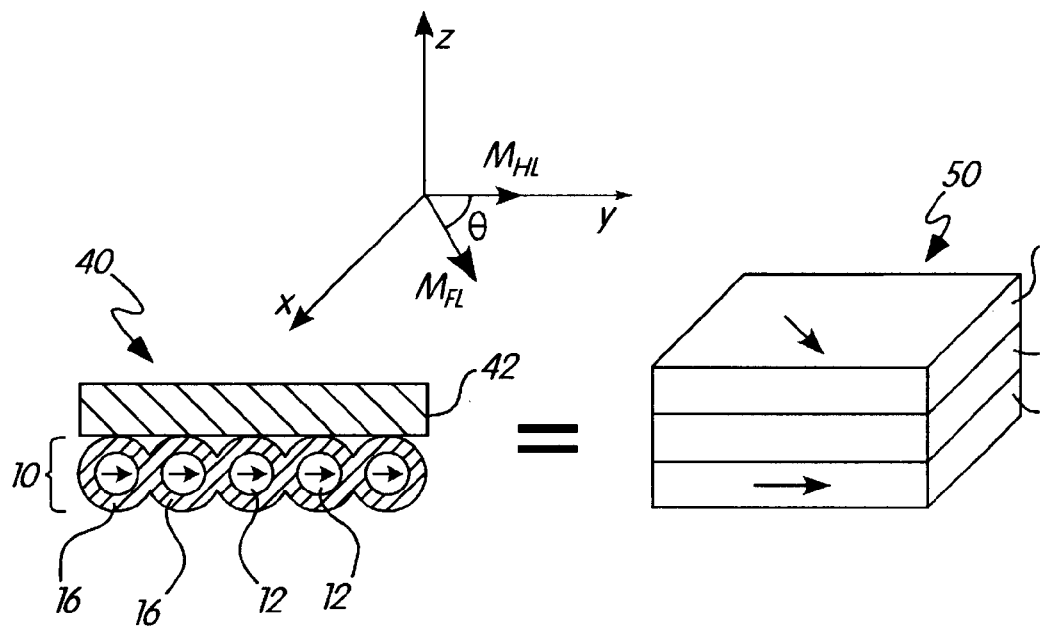
FIG. 3(a) illustrates that the collective effect of the nanoparticle monolayer is to act as a single hard magnetic layer, which in the figure has a remnant magnetization along the positive y-direction.
Figure 3B:
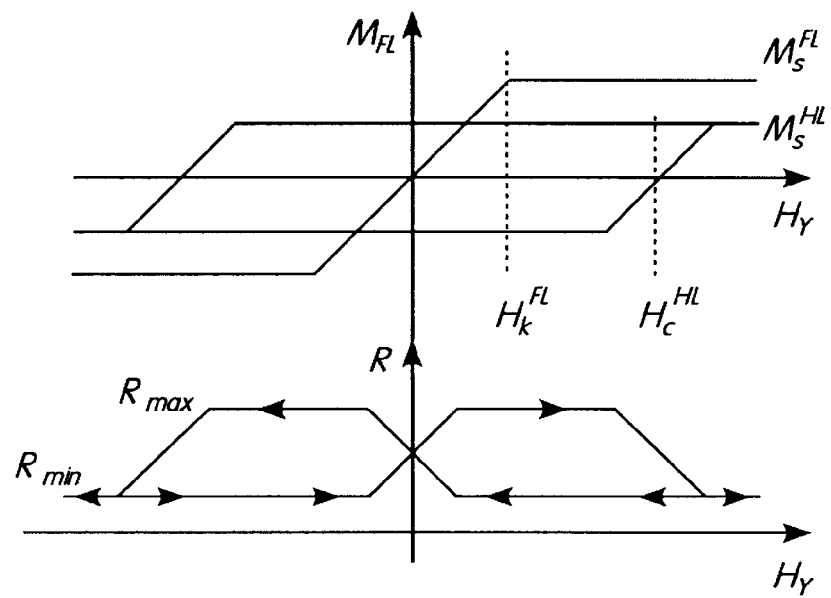
FIG. 3(b) shows M-H loops and transfer curves for the device.

In operation, the disclosed device is similar in functionality to present spin valve type devices or GMR devices. FIG. 3(a) shows examples of the magnetic characteristics of the device and FIG. 3(b) shows the magnetoresistive transfer curves. Device 40 in FIG. 3(a), according to this invention, is the functional equivalent to prior art device 50, where the free layer 42 of device 40 is functionally equivalent to free layer 42 of device 50, and monolayer 10 is functionally equivalent to insulating tunnel barrier 44 and hard layer 46 of the prior art device. In this case coating 16 acts as the insulating tunnel barrier while nanoparticles 12 act as the magnetic hard layer.

As can be seen in FIG. 3(a), the hard layer has a large uniaxial anisotropy in the wafer plane while the anisotropy and biasing of the free layer depends upon the application. For recording heads, the quiescent state of the device has the free layer magnetization biased 90° with respect to the hard layer and in the plane of the film. Fringe fields from the media rotate the free layer magnetization towards parallel or anti-parallel, thereby varying the resistance between low (parallel) and high (antiparallel).

The relative orientation of the magnetization of the free layer is measured by applying a CPP bias current and monitoring the junction voltage. The resistance of the device is dependent on the relative orientation of the free layer and hard layer magnetizations and can be expressed as $R(\theta) = R_0 - (\Delta R/2)\cos(\theta)$, where $\theta$ is the relative angle between the free layer and hard layer magnetizations, $R_0$ is the resistance when $\theta = \pi/2$, and $\Delta R$ is the difference in resistance between the antiparallel ($\theta = \pi$) and parallel ($\theta = 0$) configurations.

Because this device intrinsically has two effective tunnel barriers (one between the free layer 14 and hard layer (nanoparticles) 12, and one between hard layer 12 and non-magnetic lead 18), there is also a resistance contribution from the tunnel barrier between hard layer 12 and non-magnetic lead 18. Given the quantized nature of the molecular-based insulator, this barrier will have the same resistance as the barrier between free layer 14 and hard layer 12. While a double barrier tunnel junction has twice the resistance of a single barrier junction, this is potentially outweighed by the benefits of being able to molecularly engineer the barrier and possibly reduce the resistance-area product (R*A) by another order of magnitude. Magnetoresistance, on the other hand, only occurs as the result of tunneling processes between free layer 14 and hard layer 12. Electrons tunneling from non-magnetic lead 18 have no net spin polarization and, hence, no magnetoresistance will occur. Additionally, there will be no resistance changes due to electrons tunneling between nanoparticles because the magnetization of each nanoparticle is fixed.

The magnetization curves in FIG. 3(b) show the behavior for a device with the hard layer anisotropy along the y-direction, the free layer anisotropy and/or bias along the x-direction, and an external magnetic field applied along the y-direction. The transfer curve evolves according to the relative orientation of the two magnetic moments, exhibiting low resistance for parallel alignment and high resistance for anti-parallel alignment.

In application, this tunnel junction can be applied to any device that requires a magnetoresistive transducer. The device as used in a magnetic read head is shown schematically in FIG. 4(a), and its use in an individual memory cell in an array of MRAM cells as shown schematically in FIG. 4(b). Finally, there is also the potential use of magnetic tunnel junctions as field sensors.

Figure 4A:
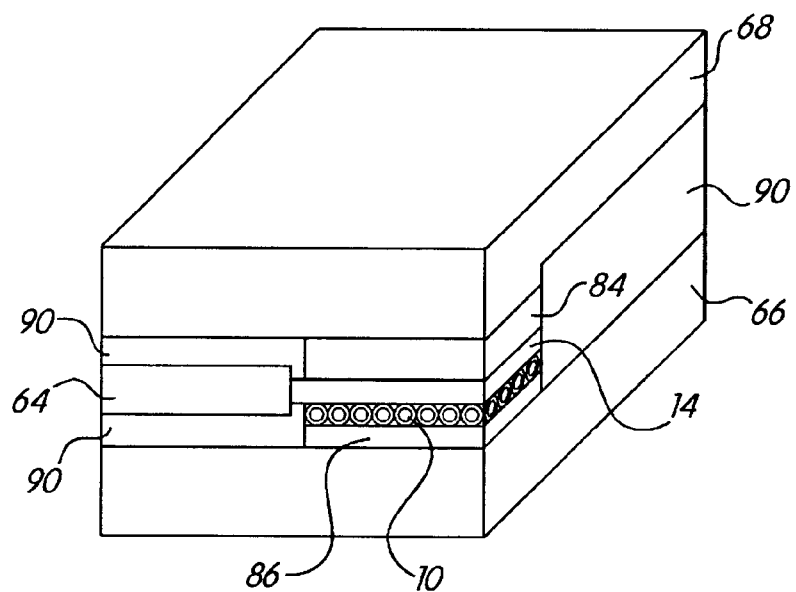
FIG. 4(a) shows the use of the tunnel junction in a magnetic read head.

In FIG. 4(a), an exemplary magnetic read head is shown which comprises monolayer 10, free layer 14, electrical contacts 84 and 86, shields 66 and 68 and insulator 90. Free layer 14 of the tunnel junction is biased into the appropriate operating region by permanent magnet 64, and the sensing current flows in a current-perpendicular-to-the-plane (CPP) manner, through bottom and top shields 66 and 68 respectively. In all other ways, this read head operates as a standard prior art spin valve based read head.

Figure 4B:
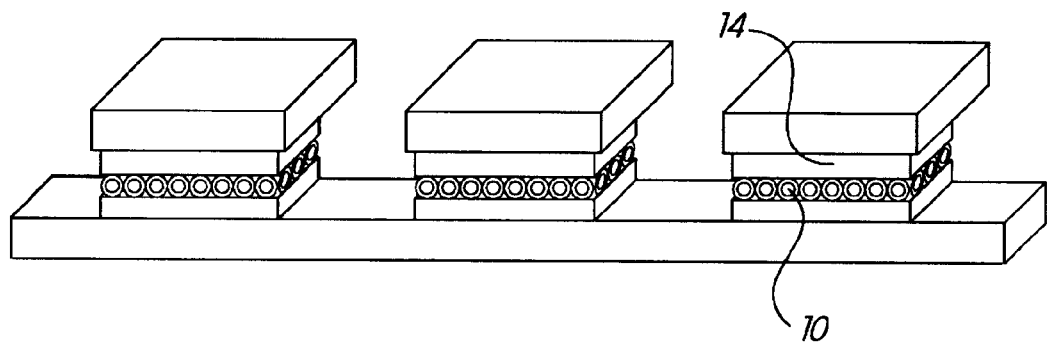
FIG. 4 (b) shows its use as a memory cell.

FIG. 4(b) shows an MRAM memory array using tunnel junction devices as individual memory cells. In this case, the magnetization of the free layer will be flipped between parallel and anti-parallel configurations with respect to the hard layer to represent binary "0" or binary "1" states. The flipping of the magnetization of the free layer can be accomplished by any means well known in the art.

I have disclosed herein a novel tunnel junction using a monolayer of coated nanoparticles as the hard layer and insulating barrier, which can be used as a magnetoresistive sensor. Several applications of the device have also been identified. The invention is delineated by the scope of the following claims and any examples of materials, processes or applications in the specification should not be taken as limiting the invention in any manner.

What is claimed is:

1. A tunnel junction device comprising:
   a free layer composed of a soft magnetic material; and
   a hard magnetic layer comprising a monolayer of ferromagnetic nanoparticles adjoining said free layer; wherein said ferromagnetic nanoparticles are coated with a carbon based coating, wherein said carbon based coating forms a tunnel barrier between said free layer and said nanoparticles.

2. The device of claim 1 wherein said nanoparticles are composed of a material selected from the group comprising Co and FePt.

3. The device of claim 1 wherein said nanoparticles are approximately 20 nm or less in diameter.

4. The device of claim 3 wherein said individual ones of said nanoparticles vary in size from all other nanoparticles by a standard deviation of approximately 10% or less.

5. The device of claim 1 wherein said layer of nanoparticles is at least one nanoparticle thick.

6. The device of claim 1 wherein said monolayer is not locally more than one nanoparticle thick.

7. The device of claim 6 wherein said monolayer defines gaps therein.

8. The device of claim 7 wherein said gaps defined in said monolayer are filled by one or more layers of hydrocarbon-based molecules.

9. The device of claim 8 wherein said hydrocarbon-based molecules comprise:
   chains of hydrocarbon molecules; and
   one or more different molecules at one or both ends of said chain of hydrocarbon molecules;
   said one or more different molecules being selected to chemically bond with any adjacent layers of material.

10. The device of claim 8 wherein said one or more different molecules are thiols.

11. The device of claim 1 wherein said monolayer has been annealed to order said nanoparticles into a crystallographic phase having a large magnetic anisotropy.

12. The device of claim 11 wherein said monolayer has been annealed at approximately 500° C. for approximately 30 minutes.

13. The device of claim 11 wherein said monolayer has been annealed in the presence of a magnetic field applied within the plane of the monolayer.

14. The device of claim 1 further comprising:
   a first layer of non-magnetic, electrically conductive material adjacent said free layer; and
   a second layer of non-magnetic, electrically conductive material adjacent said monolayer.

15. The device of claim 14 further comprising a biasing structure to bias said free layer such that its magnetization is approximately orthogonal to the magnetization of said monolayer.

16. The device of claim 15 wherein said biasing structure is a permanent magnet.

17. The device of claim 14 further comprising a means for holding the magnetization of said free layer either parallel to or anti-parallel to the magnetization of said monolayer.

18. A method of manufacturing a tunnel junction comprising:
   depositing a first layer of non-magnetic, electrically conductive material;
   depositing a monolayer of nanoparticles having a carbonaceous coating;
   annealing said monolayer of nanoparticles;
   depositing a layer of soft magnetic material adjoining said monolayer of nanoparticles; and
   depositing a second layer of a non-magnetic, electrically conductive adjacent said soft magnetic material.

19. The method of claim 18 wherein said nanoparticles are FePt nanocrystals.

20. The method of claim 19 wherein said nanoparticles are annealed in the presence of a magnetic field.

* * * * *

UNITED STATES PATENT AND TRADEMARK OFFICE
CERTIFICATE OF CORRECTION

PATENT NO. : 6,730,395 B2  
DATED : May 4, 2004  
INVENTOR(S) : Mark William Covington Page 1 of 1

It is certified that error appears in the above-identified patent and that said Letters Patent is hereby corrected as shown below:

Title page,  
Item [54], Title, change "JUNCTION" to -- JUNCTIONS --.  
Item [56], References Cited, OTHER PUBLICATIONS, please insert the following reference:  
-- Zhang, Jing, Will Spin-Dependent Tunneling Junctions Succeed Spin Valves?, http://ds.pennnet.com/content/Articles/p...ION_ID=14&ARTICLE_ID=38233&VERSION_NUM=. --  
Item [74], *Attorney, Agent or Firm*, change "Cavleton" to -- Carleton --.

Signed and Sealed this

Sixth Day of July, 2004

JON W. DUDAS  
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,730,395 B2 | Page 1 of 1 |
| APPLICATION NO. | : 09/683357 | |
| DATED | : May 4, 2004 | |
| INVENTOR(S) | : Mark William Covington | |

It is certified that error appears in the above-identified patent and that said Letters Patent is hereby corrected as shown below:

In column 8, line 11, after "conductive", insert --material--.

Signed and Sealed this

Fourth Day of September, 2007

JON W. DUDAS
*Director of the United States Patent and Trademark Office*